United States Patent
Liu et al.

(10) Patent No.: US 10,457,555 B2
(45) Date of Patent: Oct. 29, 2019

(54) METHOD FOR MAKING CARBON NANOTUBE ARRAY

(71) Applicants: Tsinghua University, Beijing (CN); HON HAI PRECISION INDUSTRY CO., LTD., New Taipei (TW)

(72) Inventors: Liang Liu, Beijing (CN); Qi Cai, Beijing (CN); Qiu-Qiu Zheng, Beijing (CN)

(73) Assignees: Tsinghua University, Beijing (CN); HON HAI PRECISION INDUSTRY CO., LTD., New Taipei (TW)

(*) Notice: Subject to any disclaimer, the term of this patent is extended or adjusted under 35 U.S.C. 154(b) by 4 days.

(21) Appl. No.: 15/990,927

(22) Filed: May 29, 2018

(65) Prior Publication Data
US 2018/0354801 A1 Dec. 13, 2018

(30) Foreign Application Priority Data
Jun. 7, 2017 (CN) .......................... 2017 1 0423281

(51) Int. Cl.
*C01B 32/162* (2017.01)
*B82B 3/00* (2006.01)
*C01B 32/168* (2017.01)
*B82Y 40/00* (2011.01)
*B82Y 30/00* (2011.01)

(52) U.S. Cl.
CPC .......... *C01B 32/162* (2017.08); *B82B 3/0004* (2013.01); *C01B 32/168* (2017.08); *B82Y 30/00* (2013.01); *B82Y 40/00* (2013.01); *C01B 2202/24* (2013.01)

(58) Field of Classification Search
CPC . C01B 32/162; C01B 2202/24; C01B 32/168; B82B 3/0004; B82Y 30/00; B82Y 40/00
See application file for complete search history.

(56) References Cited

U.S. PATENT DOCUMENTS

| 2007/0048211 A1 | 3/2007 | Jiang et al. |
| 2011/0135894 A1 | 6/2011 | Liu et al. |
| 2013/0295320 A1 | 11/2013 | Liu et al. |

FOREIGN PATENT DOCUMENTS

| CN | 101348248 A * | 1/2009 |
| TW | 1313670 | 8/2009 |
| TW | 201125816 A | 8/2011 |

(Continued)

OTHER PUBLICATIONS

Wang, Miao, et al. "Wafer-scale transfer of vertically aligned carbon nanotube arrays." Journal of the American Chemical Society 136.52 (2014): 18156-18162.*

(Continued)

*Primary Examiner* — Richard M Rump
(74) *Attorney, Agent, or Firm* — ScienBiziP, P.C.

(57) ABSTRACT

A method for making carbon nanotube array includes depositing a catalyst layer on a substrate surface of a growth substrate, to form a composite structure. The composite structure is placed in a chamber. The carbon source gas and protective gas are supplied to the chamber, and the composite structure is heated to a first temperature, to grow a carbon nanotube array on the substrate surface. Then the carbon nanotube is oxidized.

18 Claims, 1 Drawing Sheet

(56) References Cited

FOREIGN PATENT DOCUMENTS

TW 201345830 A 11/2013

OTHER PUBLICATIONS

Huang, Jia-Qi, et al. "The release of free standing vertically-aligned carbon nanotube arrays from a substrate using CO2 oxidation." Carbon 48.5 (2010): 1441-1450.*

Kim, Dong Young, et al. "Fluidized-bed synthesis of sub-millimeter-long single walled carbon nanotube arrays." Carbon 50.4 (2012): 1538-1545.*

Yo-Sep Min et al., Ruthenium Oxide Nanotube Arrays Fabricated by Atomic Layer Deposition Using a Carbon Nanotube Template, Advanced Materials, Jun. 17, 2003,1019-1022, vol. 15/Iss.12.

Li Qingwen et al., Defect Location of Individual Single-Walled Carbon Nanotubes with a Thermal Oxidation Strategy, J. Phys. Chem. B, Oct. 4, 2002, 11085-11088, 106(43).

Michael Q. Tran et al., Thermal Oxidative Cutting of Multi-Walled Carbon Nanotubes, Carbon, Aug. 1, 2007, 2341-2350, 45(12).

\* cited by examiner

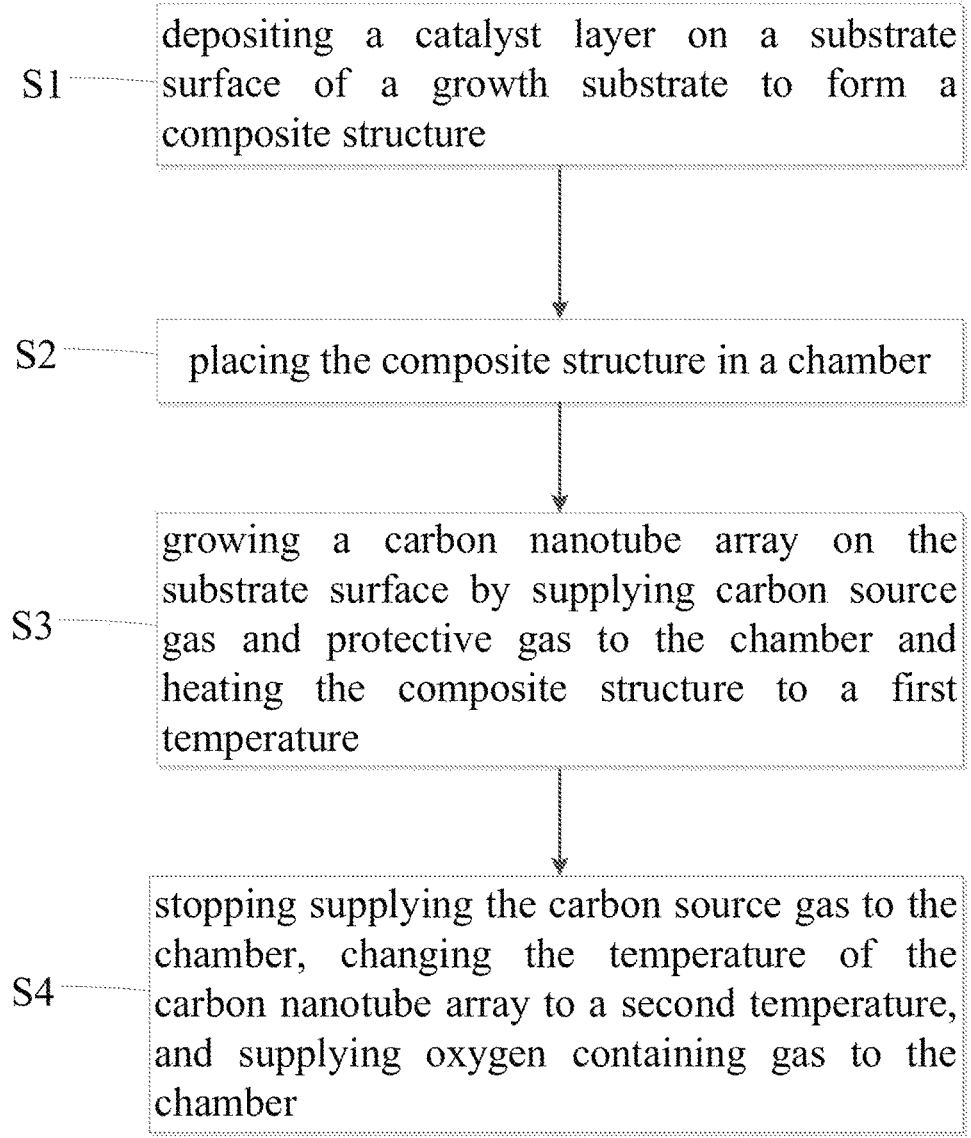

METHOD FOR MAKING CARBON NANOTUBE ARRAY

CROSS-REFERENCE TO RELATED APPLICATIONS

This application claims all benefits accruing under 35 U.S.C. § 119 from China Patent Application No. 201710423281.5, filed on Jun. 7, 2017, in the China Intellectual Property Office. This application is related to commonly-assigned applications entitled, "METHOD FOR MAKING CARBON NANOTUBE ARRAY", concurrently filed; "METHOD FOR SEPARATING CARBON NANOTUBE ARRAY FROM GROWTH SUBSTRATE", concurrently filed; "DEVICE FOR MAKING CARBON NANOTUBE ARRAY", concurrently filed. Disclosures of the above-identified applications are incorporated herein by reference.

FIELD

The present application relates to a method for making carbon nanotube array.

BACKGROUND

Carbon nanotubes can be composed of a number of coaxial cylinders of graphite sheets, and have recently attracted a great deal of attention for use in different applications, such as field emitters, chemical sensors, and so on. The carbon nanotubes can be prepared by Chemical Vapor Deposition (CVD), Arc Discharge, or Laser Ablation. When a carbon nanotube array is grown on a growth substrate by the CVD method, the carbon nanotube array adheres to the growth substrate and can be difficult to separate the carbon nanotube array from the growth substrate. Furthermore, it is difficult to obtain an integrated carbon nanotube array by peeling the carbon nanotube array from the growth substrate using a knife or a tweezers, because the bonding force between the carbon nanotubes and the growth substrate is strong.

What is needed, therefore, is to provide a method for making carbon nanotube array that can overcome the above-described shortcomings.

Therefore, there is room for improvement in the art.

BRIEF DESCRIPTION OF THE DRAWINGS

Implementations of the present technology will now be described, by way of example only, with reference to the attached FIGURES, wherein:

FIG. 1 is a schematic process flow of an embodiment of a method for making a carbon nanotube array.

DETAILED DESCRIPTION

It will be appreciated that for simplicity and clarity of illustration, where appropriate, reference numerals have been repeated among the different FIGURES to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the FIGURES of the accompanying drawings in which like references indicate similar elements. It should be noted that references to "an" or "one" embodiment in this disclosure are not necessarily to the same embodiment, and such references mean at least one.

Referring to FIG. 1, a method for making a carbon nanotube array includes one or more of the following steps:

S1, depositing a catalyst layer on a substrate surface of a growth substrate to form a composite structure;

S2, placing the composite structure in a chamber;

S3, growing a carbon nanotube array on the substrate surface by supplying carbon source gas and protective gas to the chamber and heating the composite structure to a first temperature; and S4, stopping supplying the carbon source gas to the chamber, changing the temperature of the carbon nanotube array to a second temperature, and supplying oxygen containing gas to the chamber.

During step S1, the growth substrate is resistant to high temperature. The material of the growth substrate can be silicon, quartz, or the like. In one embodiment, the growth substrate is a silicon wafer, a protective layer is formed on the silicon wafer, for example, the protective layer is a silicon oxide layer, and the thickness of the silicon oxide layer ranges from about 1 nanometer to about 1000 nanometers. The substrate surface can be treated by mechanical polishing or electrochemical polishing, to ensure the smoothness of the substrate surface to meet the needs of growing the carbon nanotube array. The shape and size of the growth substrate are not limited. The substrate surface can be flat or curved, and the size of growth substrate can be 4 inches, 8 inches, or 12 inches.

The thickness of the catalyst layer ranges from about 1 nanometer to about 10 nanometers. In one embodiment, the thickness of the catalyst layer ranges from about 1 nanometer to about 5 nanometers. The catalyst layer can be formed on the substrate surface by evaporation, sputtering, or chemical deposition. The material of the catalyst layer can be iron, cobalt, nickel, or an alloy of any combination thereof. The catalyst layer can further be annealed, the annealing temperature ranges from about 200 degrees Celsius to about 400 degrees Celsius, and the annealing time ranges from about 8 hours to about 12 hours. After annealing the catalyst layer in an air atmosphere, the catalyst layer can be oxidized to form metal oxide, and the catalyst layer can become uniformly distributed metal oxide catalyst nanoparticles. The catalytic activity of the catalyst nanoparticles is better than the catalytic activity of the continuous catalyst layer.

If the catalyst layer is deposited on the silicon substrate, the metal of the catalyst layer may react with the silicon substrate to form an alloy, and this alloy would affect the activity of the catalyst layer. Thus, before the catalyst layer is deposited on the silicon substrate, a catalyst carrier layer can be formed on the silicon substrate. Thus, the metal of the catalyst layer cannot react with the silicon substrate, and the activity of the catalyst layer would not be affected. The material of the catalyst carrier layer can be aluminum (Al), aluminum oxide ($Al_2O_3$), silicon oxide ($SiO_2$), or magnesium oxide (MgO). The thickness of the catalyst carrier layer ranges from about 1 nanometer to about 10 nanometers. In one embodiment, the catalyst carrier layer is an aluminum layer, and the thickness of the aluminum layer ranges from about 3 nanometer to about 7 nanometers.

During step S3, the first temperature is the growth temperature of the carbon nanotube array. The first temperature ranges from 600 degrees Celsius to 720 degrees Celsius. In one embodiment, the first temperature ranges from 620 degrees Celsius to 700 degrees Celsius. The composite structure is heated to the first temperature in a protective gas atmosphere, and then the mixed gas of the carbon source gas and the protective gas is supplied into the chamber, so that the carbon nanotube array is formed on the substrate surface by chemical vapor deposition. The time for supplying the mixed gas of the carbon source gas and the protective gas ranges from about 10 minutes to about 40 minutes. The protective gas is an inert gas or nitrogen. The carbon source gas is a hydrocarbon compound, such as acetylene, ethylene, methane, ethane, or the like. During growing the carbon nanotube array on the substrate surface, the pressure in the chamber ranges from about 2 torrs to 8 torrs.

The carbon source gas, such as acetylene, is pyrolyzed into carbon units (—C≡C— or C) and hydrogen ($H_2$) gas due to the catalysis of the catalyst layer. When the hydrogen gas diffuses to the surface of the metal oxide catalyst nanoparticles, the metal oxide catalyst nanoparticles can be reduced to metal catalyst nanoparticles. Thus, the oxidized catalyst can be reduced and activated. Then, the carbon units are adsorbed on the surface of catalyst layer, thereby growing the carbon nanotube array on the substrate surface.

During step S4, after finishing growing the carbon nanotube array, stop supplying the carbon source gas to the chamber, and keep supplying the protective gas to the chamber. Then, the oxygen containing gas is supplied to the chamber, and the carbon nanotube array is oxidized at the second temperature, to form an oxidized carbon nanotube array. The second temperature can be in a range from about 500 degrees Celsius to about 800 degrees Celsius. The carbon nanotube array can be heated to the second temperature by changing the temperature of the chamber to the second temperature. The flow rate of oxygen containing gas ranges from about 300 standard millimeters per minute (sccm) to 500 sccm. The oxygen containing gas can be pure oxygen or air. The reacting time between the carbon nanotube array and the oxygen containing gas is the time for oxidizing the carbon nanotube array by the oxygen containing gas and defined as an oxidizing time, and the oxidizing time is in a range from about 5 minutes to about 20 minutes. In the step S4, the pressure in the chamber is kept in a range from about 2 torrs to about 8 torrs.

After oxidizing the carbon nanotube array is finished, the supplying of the oxygen containing gas to the chamber is stopped, thought the flow of protective gas to the chamber is continued. The flow rate of the protective gas can be increased, by providing more protective gas into the chamber. After the temperature in the chamber falls below 400 degrees Celsius, the growth substrate and the oxidized carbon nanotube array are slowly taken out of the chamber. In one embodiment, the temperature of the chamber naturally falls below 400 degrees Celsius.

After step S4, the oxidized carbon nanotube array can further be separated from the growth substrate. For example, after the growth substrate and the oxidized carbon nanotube array are taken out of the chamber, the oxidized carbon nanotube array can be separated from the growth substrate by just shaking the growth substrate. When the growth substrate is stand up, the oxidized carbon nanotube array separates from the growth substrate because of the weight of the carbon nanotube array itself. The oxidized carbon nanotube array can also be separated from the growth substrate just by blowing on the oxidized carbon nanotube array, such as only blowing the oxidized carbon nanotube array by mouth. Alternatively, the oxidized carbon nanotube array is more easily peeled from the growth substrate using a knife or a tweezers than the non-oxidized carbon nanotube array. Furthermore, when the growth substrate and the oxidized carbon nanotube array are taken out of the chamber, taking the growth substrate and the oxidized carbon nanotube array out of the chamber cannot too fast, and the speed of taking the growth substrate and the oxidized carbon nanotube array out of the chamber is greater than 0 cm/min and less than 100 cm/min. When the speed of taking the growth substrate and the oxidized carbon nanotube array out of the chamber is greater than or equal to 100 cm/min, the oxidized carbon nanotube array can fall off the growth substrate.

The second temperature, the oxidizing time, and the flow rate of oxygen containing gas are related to the quality of the carbon nanotube array. When the quality of the carbon nanotube array is low, for example, the carbon nanotube array contains many defects and amorphous carbons, the second temperature can be appropriately decreased, the oxidizing time can be shortened, and the flow rate of the oxygen containing gas can be decreased. When the quality of the carbon nanotube array is high, for example, the carbon nanotube array substantially has no impurity, the second temperature can be appropriately increased, the oxidizing time can be prolonged, and the flow rate of the oxygen containing gas can be increased.

It can be understood that when the second temperature and the flow rate of the oxygen containing gas are constant, the oxidizing time cannot be too long or too short, as long as the oxidized carbon nanotube array can separated from the growth substrate easily. When the oxidizing time is too long, the carbon nanotube array is can be seriously damaged and the height of the carbon nanotube array will be greatly reduced. When the oxidizing time is too short, separating the oxidized carbon nanotube array from the growth substrate can be difficult.

The carbon nanotube array includes a plurality of carbon nanotubes. Each carbon nanotube includes a top end, a bottom end, and a middle portion between the top end and the bottom end. In the process of growing the carbon nanotube array, for each carbon nanotube, first the top end grows, then the middle portion grows, and finally the bottom end grows. At the later growth stage of the carbon nanotube array, the catalytic activity of the catalyst layer decreases, resulting in the bottom end having more defects than the top end and the middle portion. When the oxygen containing gas is supplied to the carbon nanotube array, the oxygen containing gas can contact the top end, the bottom end, and the middle portion of each carbon nanotube. However, it is easier for the oxygen containing gas to react with the bottom end than to react with the top end and the middle portion, because the bottom end has more defects than the top end and the middle portion. The reaction between the oxygen containing gas and the bottom end produces carbon dioxide and weakens the bonding force between each carbon nanotube and the substrate surface of the growth substrate. The middle portion of each carbon nanotube only has a few defects, thus it is not easy for the middle portion to react with the oxygen containing gas, thereby keeping the integrity of the carbon nanotube array.

After the carbon nanotube array reacts with the oxygen containing gas for a period of time, the bonding force between the bottom of each carbon nanotube and the substrate surface weakens by oxidizing the bottom end. Thus, the bottom end of each carbon nanotube can be separated from the growth substrate only by simple mechanical vibration, such as lightly shaking the growth substrate, or lightly peeling with the knife or the tweezers. Thus, the structure of the carbon nanotube array cannot be destroyed, and an integrated carbon nanotube array can be obtained. Additionally, when the bottom end of each carbon nanotube is separated from the growth substrate, the catalyst layer remains on the substrate surface of the growth substrate. The carbon nanotube array contains a few catalyst metal particles or does not contain the catalyst metal particles after being separated from the growth substrate, thereby improving the quality or the purity of the carbon nanotube array.

The carbon nanotube array and the oxidized carbon nanotube array are the same except for bottom ends. The bottom ends of the carbon nanotube array are not be oxidized, and the oxidized carbon nanotube array are be oxidized. Furthermore, the carbon nanotube array is a free-standing structure. The term "free-standing" includes, but not limited to, the carbon nanotube array that does not have to be supported by a substrate. For example, the free-standing carbon nanotube array can sustain the weight of itself when it is hoisted by a portion thereof without any significant damage to its structural integrity. So, if the free-standing carbon nanotube array is placed between two separate supporters, a portion of the free-standing carbon nanotube array, not in contact with the two supporters, would be suspended between the two supporters and yet maintain film structural integrity. The oxidized carbon nanotube array is also a free-standing structure. The oxidized carbon nanotube array separated from the growth substrate is still a free-standing structure. The specific embodiments are provided as follows.

Example 1

A 5-nm-thick aluminum layer is deposited on an 8-inch silicon wafer, and then a 2-nm-thick iron catalyst layer is deposited on the surface of the aluminum layer away from the silicon wafer, to form the composite structure. In an air atmosphere, the composite structure is annealed at 300 degrees Celsius for 10 hours. The annealed composite structure is placed in the chamber. The chamber is heated to 700 degrees Celsius in a nitrogen atmosphere, and an acetylene and nitrogen gas mixture is supplied to the chamber. After 20 minutes, a carbon nanotube array is formed on the silicon wafer. The acetylene gas flow to the chamber is stopped, and the nitrogen gas flow to the chamber is continued. Then an oxygen and nitrogen gas mixture is supplied to the chamber, and the temperature of the chamber kept at 700 degrees Celsius. After an oxidizing time ranging from 9 minutes to 10 minutes, the carbon nanotube array oxidizes to form the oxidized carbon nanotube array. The flow rate of the oxygen containing gas is 500 sccm. Then the chamber is allowed to naturally cool to make the temperature of the chamber fall below 350 degrees Celsius. When the temperature of the chamber falls below 350 degrees Celsius, the silicon wafer and the oxidized carbon nanotube array are slowly taken out of the chamber. The oxidized carbon nanotube array is separated from the silicon wafer, for example, by only shaking the silicon wafer.

Example 2

A 5-nm-thick aluminum layer is deposited on an 8-inch silicon wafer, and then a 2-nm-thick iron catalyst layer is deposited on the surface of the aluminum layer away from the silicon wafer, to form the composite structure. In an air atmosphere, the composite structure is annealed at 300 degrees Celsius for 10 hours. The annealed composite structure is placed in the chamber. The chamber is heated to 700 degrees Celsius in a nitrogen atmosphere, and an acetylene gas and nitrogen gas mixture is supplied to the chamber. After 20 minutes, a carbon nanotube array is formed on the silicon wafer. The acetylene gas flow to the chamber is stopped, and the nitrogen gas flow to the chamber is continued. Then an oxygen gas and nitrogen gas mixture is supplied to the chamber, and the temperature of the chamber is heated to 800 degrees Celsius. After an oxidizing time ranging from 5 minutes to 7 minutes the carbon nanotube array oxidizes to form the oxidized carbon nanotube array. The flow rate of the oxygen containing gas is 300 sccm. Then the chamber is allowed to naturally cool to make the temperature of the chamber falls below 350 degrees Celsius. When the temperature of the chamber falls below 350 degrees Celsius, the silicon wafer and the oxidized carbon nanotube array are slowly taken out of the chamber. The oxidized carbon nanotube array is separated from the silicon wafer, for example, by only making the growth substrate stand up.

Example 3

A 5-nm-thick aluminum layer is deposited on an 8-inch silicon wafer, and then a 2-nm-thick iron catalyst layer is deposited on the surface of the aluminum layer away from the silicon wafer, to form the composite structure. In an air atmosphere, the composite structure is annealed at 300 degrees Celsius for 10 hours. The annealed composite structure is placed in the chamber. The chamber is heated to 700 degrees Celsius in a nitrogen atmosphere, and an acetylene gas and nitrogen gas mixture is supplied to the chamber. After 20 minutes, a carbon nanotube array is formed on the silicon wafer. The acetylene gas flow to the chamber is stopped, and the nitrogen gas flow to the chamber is continued. Then the chamber is allowed to naturally cool, and an oxygen containing gas and nitrogen gas mixture is supplied to the chamber in the process of cooling the chamber. After an oxidizing time ranging from 13 minutes to 15 minutes, the carbon nanotube array oxidizes to form the oxidized carbon nanotube array. The flow rate of the oxygen containing gas is 500 sccm. Then keep cooling the chamber, to make the temperature of the chamber falls below 350 degrees Celsius. When the temperature of the chamber falls below 350 degrees Celsius, the silicon wafer and the oxidized carbon nanotube array are slowly taken out of the chamber. The oxidized carbon nanotube array is separated from the silicon wafer, for example, by only blowing on the oxidized carbon nanotube array using mouth.

Example 4

A 5-nm-thick aluminum layer is deposited on an 8-inch silicon wafer, and then a 2-nm-thick iron catalyst layer is deposited on the surface of the aluminum layer away from the silicon wafer, to form the composite structure. In an air atmosphere, the composite structure is annealed at 300 degrees Celsius for 10 hours. The annealed composite structure is placed in the chamber. The chamber is heated to 700 degrees Celsius in a nitrogen atmosphere, and an acetylene gas and nitrogen gas mixture is supplied to the chamber. After 20 minutes, a carbon nanotube array is formed on the silicon wafer. The acetylene flow to the chamber is stopped, and the nitrogen gas flow to the chamber is continued. Then the chamber is allowed to naturally cool, to make the temperature of the chamber falls to 500 degrees Celsius, and an oxygen gas and nitrogen gas mixture is supplied to the chamber. After an oxidizing time ranging from 16 minutes to 20 minutes, the carbon nanotube array oxidizes to form the oxidized carbon nanotube array. The flow rate of the oxygen containing gas is 500 sccm. Then the chamber is allowed to naturally cool to make the temperature of the chamber falls below 350 degrees Celsius. When the temperature of the chamber falls below 350 degrees Celsius, the silicon wafer and the oxidized carbon nanotube array are slowly taken out of the chamber. The oxidized carbon nanotube array is separated from the silicon wafer, for example, by only shaking the silicon wafer.

Comparative Example

A 5-nm-thick aluminum layer is deposited on an 8-inch silicon wafer, and then a 2-nm-thick iron catalyst layer is deposited on the surface of the aluminum layer away from the silicon wafer, to form the composite structure. In an air atmosphere, the composite structure is annealed at 300 degrees Celsius for 10 hours. The annealed composite structure is placed in the chamber. The chamber is heated to 700 degrees Celsius in a nitrogen atmosphere, and an acetylene gas and nitrogen gas mixture is supplied to the chamber. After 20 minutes, a carbon nanotube array is formed on the silicon wafer. Then the chamber is allowed to naturally cool, to make the temperature of the chamber fall below 350 degrees Celsius. When the temperature of the chamber falls below 350 degrees Celsius, the silicon wafer and the carbon nanotube array are slowly taken out of the chamber. The carbon nanotube array cannot be separated from the silicon wafer by only making the silicon wafer stand up.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may comprise some indication in reference to certain steps. However, the indication used is only to be viewed for identification purposes and not as a suggestion as to an order for the steps.

What is claimed is:

1. A method for making a carbon nanotube array, the method comprising:
    depositing a catalyst layer on a substrate surface of a growth substrate, to form a composite structure;
    placing the composite structure in a chamber;
    growing a carbon nanotube array on the substrate surface by supplying a carbon source gas and a protective gas into the chamber and heating the inside of the chamber, containing the composite structure, to a first temperature; and
    stopping the supply of the carbon source gas to the chamber and supplying an oxygen containing gas to the chamber and oxidizing the carbon nanotube array at a second temperature, in a range from about 500 degrees Celsius to about 800 degrees Celsius for five to about 20 minutes, wherein a flow rate of the oxygen containing gas ranges from about 300 sccm to 500 sccm.

2. The method of claim 1, further comprising depositing a catalyst carrier layer on the substrate surface before depositing the catalyst layer, and a material of the catalyst carrier layer is selected from the group consisting of aluminum, aluminum oxide, silicon oxide, and magnesium oxide.

3. The method of claim 2, wherein a thickness of the catalyst carrier layer ranges from about 1 nanometer to about 10 nanometers.

4. The method of claim 2, wherein the catalyst carrier layer is an aluminum layer, and a thickness of the aluminum layer ranges from about 3 nanometer to about 7 nanometers.

5. The method of claim 1, wherein a pressure in the chamber is in a range from about 2 torrs to about 8 torrs during growing the carbon nanotube array and oxidizing the carbon nanotube array.

6. The method of claim 1, further comprising separating the carbon nanotube array from the growth substrate after oxidizing the carbon nanotube array.

7. The method of claim 6, wherein the separating the carbon nanotube array from the growth substrate comprises shaking the growth substrate.

8. The method of claim 6, wherein the separating the carbon nanotube array from the growth substrate comprises peeling the carbon nanotube array from the growth substrate.

9. The method of claim 6, wherein the separating the carbon nanotube array from the growth substrate comprises making the growth substrate stand up.

10. The method of claim 6, wherein the separating the carbon nanotube array from the growth substrate comprises blowing the carbon nanotube array after oxidizing the carbon nanotube array.

11. A method for making carbon nanotube array, the method comprising:
    depositing a catalyst layer on a substrate surface of a growth substrate, to form a composite structure;
    placing the composite structure in a chamber;
    growing a carbon nanotube array on the substrate surface by supplying a carbon source gas and a protective gas into the chamber and heating the composite structure to a first temperature; and
    oxidizing the carbon nanotube array at a second temperature by stopping supplying the carbon source gas to chamber and supplying an oxygen containing gas to the chamber, wherein a pressure in the chamber is in a range from about 2 torrs to about 8 torrs during growing the carbon nanotube array and oxidizing the carbon nanotube array.

12. The method of claim 11, further comprising separating the carbon nanotube array from the growth substrate after oxidizing the carbon nanotube array.

13. The method of claim 12, wherein the separating the carbon nanotube array from the growth substrate comprises shaking the growth substrate.

14. The method of claim 12, wherein the separating the carbon nanotube array from the growth substrate comprises making the growth substrate stand up.

15. The method of claim 12, wherein the separating the carbon nanotube array from the growth substrate comprises blowing the carbon nanotube array after oxidizing the carbon nanotube array.

16. The method of claim 11, wherein the second temperature is in a range from about 500 degrees Celsius to about 800 degrees Celsius.

17. The method of claim 11, wherein a flow rate of the oxygen containing gas ranges from about 300 sccm to 500 sccm.

18. The method of claim 11, wherein a time for oxidizing the carbon nanotube array at the second temperature is in a range from about 5 minutes to about 20 minutes.

* * * * *